(12) United States Patent
Wang et al.

(10) Patent No.: US 10,541,285 B2
(45) Date of Patent: Jan. 21, 2020

(54) PIXEL ISOLATION BANK AND METHOD OF MANUFACTURING THE SAME

(71) Applicant: BOE TECHNOLOGY GROUP CO., LTD., Beijing (CN)

(72) Inventors: Huifeng Wang, Beijing (CN); Jing Gan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/992,756

(22) Filed: May 30, 2018

(65) Prior Publication Data

US 2019/0181195 A1    Jun. 13, 2019

(30) Foreign Application Priority Data

Dec. 11, 2017   (CN) .......................... 2017 1 1311091

(51) Int. Cl.
*H01L 27/32*   (2006.01)
*H01L 51/52*   (2006.01)
*H01L 51/56*   (2006.01)

(52) U.S. Cl.
CPC ...... *H01L 27/3246* (2013.01); *H01L 27/3283* (2013.01); *H01L 51/5206* (2013.01); *H01L 51/5221* (2013.01); *H01L 51/56* (2013.01); *H01L 2227/323* (2013.01)

(58) Field of Classification Search
CPC ............. H01L 27/3246; H01L 27/3283; H01L 51/5221; H01L 2227/323
See application file for complete search history.

(56) References Cited

U.S. PATENT DOCUMENTS

2003/0124245 A1* 7/2003 Sakaguchi .......... H01L 27/3283
427/66
2015/0303393 A1* 10/2015 Dai ..................... H01L 51/0004
257/40
2016/0358987 A1* 12/2016 Hou ........................ H01L 51/52

FOREIGN PATENT DOCUMENTS

| CN | 103073848 A | 5/2013 |
|---|---|---|
| CN | 103941511 A | 7/2014 |
| CN | 105932037 A | 9/2016 |
| CN | 106206675 A | 12/2016 |
| CN | 106749903 A | 5/2017 |
| CN | 106941112 A | 7/2017 |

OTHER PUBLICATIONS

First Office Action for CN Application No. 201711311091.0, dated Jun. 4, 2019.

\* cited by examiner

*Primary Examiner* — Julia Slutsker
(74) *Attorney, Agent, or Firm* — Foley & Lardner LLP; James F. Ewing; Paul M. H. Pua

(57) ABSTRACT

The present disclosure relates to a pixel isolation bank and a method of manufacturing the same. A pixel isolation bank, comprising a first lyophobic layer located at a predetermined height of the pixel isolation bank.

20 Claims, 4 Drawing Sheets

PIXEL ISOLATION BANK AND METHOD OF MANUFACTURING THE SAME

CROSS-REFERENCE TO RELATED APPLICATIONS

The present application claims priority to Chinese Application No. 201711311091.0, filed on Dec. 11, 2017, the disclosure of which is hereby incorporated by reference in its entirety.

FIELD OF THE INVENTION

The present disclosure relates to the field of flat panel display technology, and in particular, to a display panel and a method for manufacturing the same.

BACKGROUND

Compared with the LCD display technology, the OLED display technology has advantages of self-luminescence, fast response, wide viewing angle, high brightness, bright colors, and has become a significant aspect in the development of display technology.

SUMMARY

According to one aspect of the present disclosure, a pixel isolation bank is provided, comprising a first lyophobic layer located at a predetermined height of the pixel isolation bank.

Optionally, the first lyophobic layer is made of a magnetic lyophobic material.

Optionally, the magnetic lyophobic material is a fluorine resin grafted with $Fe_3O_4$ microspheres.

Optionally, the pixel isolation bank further comprises an isolation layer located on the first lyophobic layer, wherein the material of the isolation layer is a lyophilic material.

Optionally, the pixel isolation bank further comprises a second lyophobic layer located at a top portion of the pixel isolation bank.

Optionally, the second lyophobic layer is made of a polymer with a fluorine-containing unit grafted on its backbone chain.

Optionally, the pixel isolation bank further comprises a lyophilic layer located between the first lyophobic layer and an electrode substrate.

According to another aspect of the present disclosure, a method for manufacturing a pixel isolation bank is provided. The method comprises applying a photoresist layer on one side of an electrode substrate, wherein the photoresist contains a lyophilic material and a first lyophobic material; adjusting the first lyophobic material to a predetermined height of the photoresist layer to form a first lyophobic layer; and selectively removing a portion of the adjusted photoresist layer to form the pixel isolation bank.

Optionally, the first lyophobic material is a magnetic lyophobic material, the step of adjusting the first lyophobic material to a predetermined height of the photoresist layer comprises: adjusting the first lyophobic material to the predetermined height of the photoresist layer by a magnetic field.

Optionally, the step of adjusting the first lyophobic material to a predetermined height of the photoresist layer further comprises: during a pre-baking process carried out on the photoresist layer, adjusting the magnetic lyophobic material to the predetermined height of the photoresist layer by a magnetic field.

Optionally, the magnetic lyophobic material is a fluorine resin grafted with $Fe_3O_4$ microspheres.

Optionally, the photoresist further contains a second lyophobic material that is nonmagnetic. The method further comprises forming a second lyophobic layer at a top portion of the pixel isolation bank with the second lyophobic material.

Optionally, the second lyophobic layer is made of a polymer having a fluorine-containing unit grafted on its backbone chain.

Optionally, the magnetic field is produced by an electromagnetic plate.

Optionally, the electromagnetic plate has a shape corresponding to a pattern of the pixel isolation bank.

Optionally, the step of adjusting the first lyophobic material to a predetermined height of the photoresist layer comprises: adjusting only the first lyophobic material at a position corresponding to the pattern of the pixel isolation bank to the predetermined height of the photoresist layer.

Optionally, the photoresist layer has a height of 1 μm-5 μm.

According to a further aspect of the present disclosure, a display panel is provided, comprising the above pixel isolation bank of the present disclosure.

According to a further aspect of the present disclosure, a display apparatus is provide, comprising the above display panel of the present disclosure.

DETAILED DESCRIPTION

The specific embodiments, structures, features, and effects of the pixel isolation bank proposed in the present disclosure will be described in detail below with reference to the accompanying drawings and preferred embodiments.

In the manufacture of OLED devices, two ways of film formation, i.e., evaporation and solution-based processes are mainly adopted for OLEDs. Inkjet printing technology has been widely used in the solution-based process due to its high utilization rate, and large size capability. Specifically, according to the ink-jet printing technology, ink droplets are accurately dripped into specified sub-pixel recesses to form an organic functional layer for emitting light in sub-pixel recesses. Since the sub-pixel recess is enclosed by a pixel isolation bank substantially made of a lyophilic material, in the drying process of the ink, the organic functional layer formed by the ink may climb along a sidewall of the pixel isolation bank to a certain height, which will seriously affect quality of the formed film. The higher the height is climbed to, the worse the film quality is.

Figure 1:
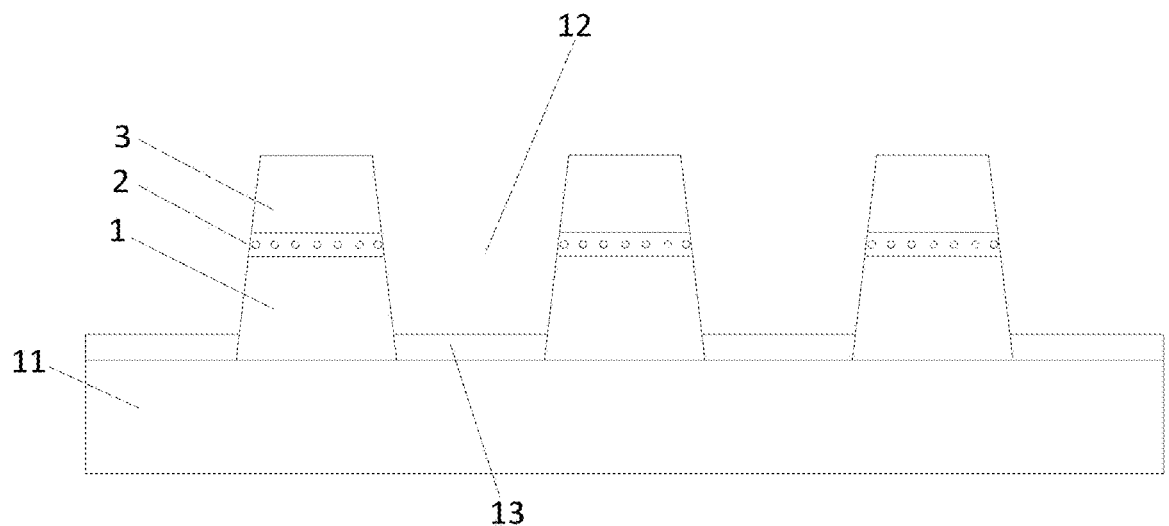
FIG. 1 is a schematic structural diagram of a pixel isolation bank according to an embodiment of the present disclosure.

FIG. 1 shows a display panel according to an embodiment of the present disclosure, including an electrode substrate 11 and a pixel isolation bank. The pixel isolation bank includes:

a lyophilic layer 1 disposed on the electrode substrate 11;

a first lyophobic layer 2 disposed on one side of the lyophilic layer 1 away from the electrode substrate 11. In an optional example, the material of the first lyophobic layer 2 may be a magnetic lyophobic material (i.e., the first lyophobic material).

The pixel isolation bank further comprises an isolation layer 3 disposed on one side of the first lyophobic layer 2 away from the lyophilic layer 1.

The lyophilic layer 1, the first lyophobic layer 2 and the isolation layer together constitute the pixel isolation bank of the display panel. As can be seen from FIG. 1, the first lyophobic layer 2 is located at a predetermined height in a middle portion of the pixel isolation bank.

An organic functional layer 13 for emitting light may be formed in a pixel recess 12 surrounded by the pixel isolation bank. The organic functional layer 13 may be formed by ink-jet printing. In the ink-jet printing process, first, ink is dripped into the pixel recess 12 surrounded by the pixel isolation bank so that the pixel recess 12 is filled up with the ink. Then, the ink is dried to form the organic functional layer 13. The thickness of the dried organic functional layer 13 may be lower than the lyophilic layer 1 of the pixel isolation bank, and the organic functional layer 13 can be in contact with the sidewall corresponding to the lyophilic layer 1 of the pixel isolation bank.

The above pixel isolation bank is an isolation structure of a photoresist formed on the electrode substrate by a photolithography process. The photoresist is generally a mixture of different polymers having different properties, for example, hydrophilic, hydrophobic, and magnetic properties, etc. Upon the pixel isolation bank is formed by the photolithography process, the polymers may form different layers of the pixel isolation bank due to their different surface energy. A material having lyophilic property gathers at the bottom of the pixel isolation bank to form the lyophilic layer 1, and a material having magnetic and lyophobic properties can gather above the lyophilic layer 1 under the action of a magnetic field to form the first lyophobic layer 2. Further, an isolation layer 3 can also be formed above the first lyophobic layer 2. The height of the pixel isolation bank can be increased by the isolation layer 3 so that the pixel recess 12 surrounded by the pixel isolation bank can accommodate more ink to increase the thickness of the organic functional layer 13.

Figure 8:
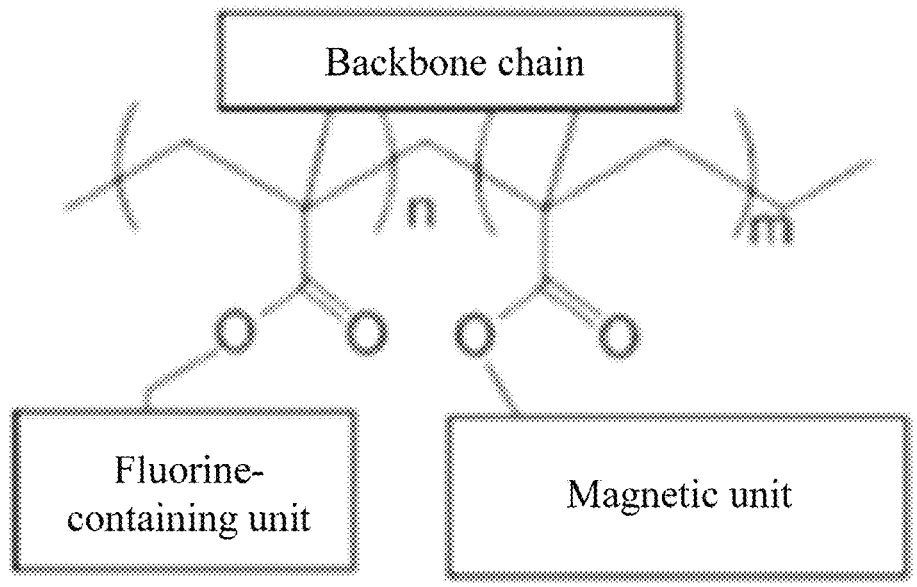
FIG. 8 is a structural formula of a magnetic lyophobic material according to an embodiment of the present disclosure.

In some embodiments according to the present disclosure, the first lyophobic layer 2 may be made of a magnetic lyophobic material (first lyophobic material). This magnetic lyophobic material may be a first polymer containing a magnetic unit, and the backbone chain of the first polymer may be grafted with a plurality of functional units. As shown in FIG. 8, the plurality of functional units may include a magnetic unit and a fluorine-containing unit having a lyophobic property. For example, the backbone chain of the first polymer may be selected from a group consisting of polyester, polyester polyurethane, polycarbonate, polycarbonate polyurethane, polyacryl, acrylic polyurethane, polyether, polyether polyurethane, ethylene vinyl alcohol copolymer, ethylene vinyl alcohol copolymer polyurethane, polyamide, polyamide-type polyurethane, polyamide-type urea, polyacrylamide and polyacrylamide-type polyurethane. The functional group of the first polymer may be selected from a group consisting of carboxylic acid, sulfonic acid, aziridine, acid anhydride, amine, isocyanate, melamine, epoxy and hydroxyl.

Optionally, the magnetic unit may be functionalized $Fe_3O_4$ microspheres. Optionally, the fluorine-containing unit may be selected from a group consisting of a homopolymer or copolymer of vinyl fluoride, a homopolymer or copolymer of vinylidene fluoride, fluoroalkyl acrylate, fluoroalkyl methacrylate, perfluoroalkyl methacrylate, fluorinated and perfluorinated olefin, fluorinated alkyl maleate, perfluorinated alkyl maleate, fluoroalkyl aryl urethane oligomer, fluoroalkyl allyl urethane oligomer, fluoroalkyl urethane acrylate oligomer. In addition, the functional group of the fluorine-containing unit may be selected from a group consisting of carboxylic acid, sulfonic acid, aziridine, acid anhydride, amine, isocyanate, melamine, epoxy and hydroxyl. The fluorine-containing unit can be connected to the backbone chain of the polymer through the above functional group.

The manufacture process and principle of the pixel isolation bank in the display panel according to present disclosure will be described below in detail.

Figure 2:
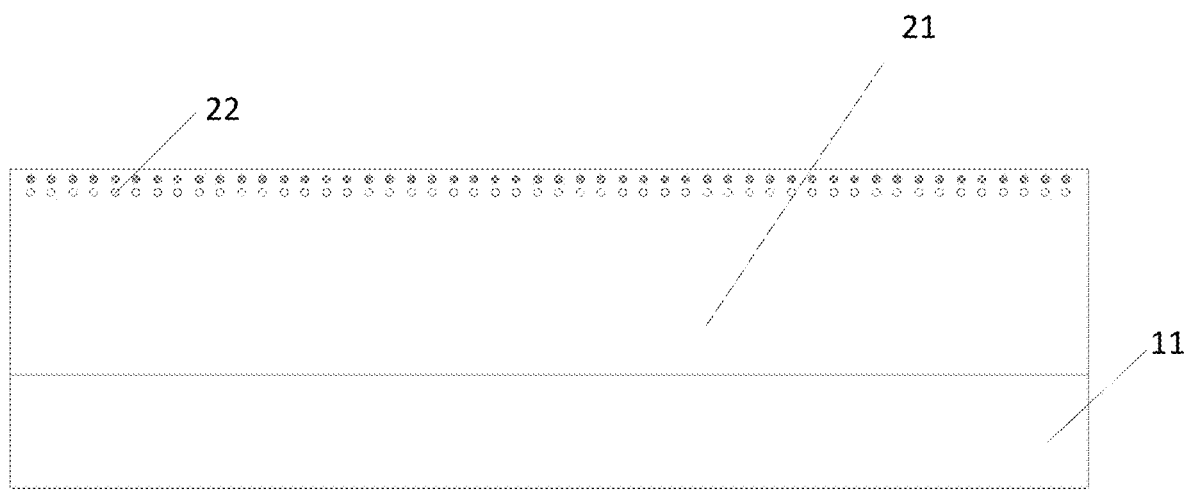
FIG. 2 is a schematic diagram of a process of manufacturing a pixel isolation bank according to an embodiment of the present disclosure.

First, as shown in FIG. 2, a photoresist is applied on one side of the electrode substrate 11 to form a photoresist layer 21. The photoresist includes a lyophilic material and a lyophobic material (a first lyophobic material, such as a magnetic lyophobic material 22). The magnetic lyophobic material 22 in the photoresist can be aggregated on top portion of the photoresist layer 21.

Figure 3:
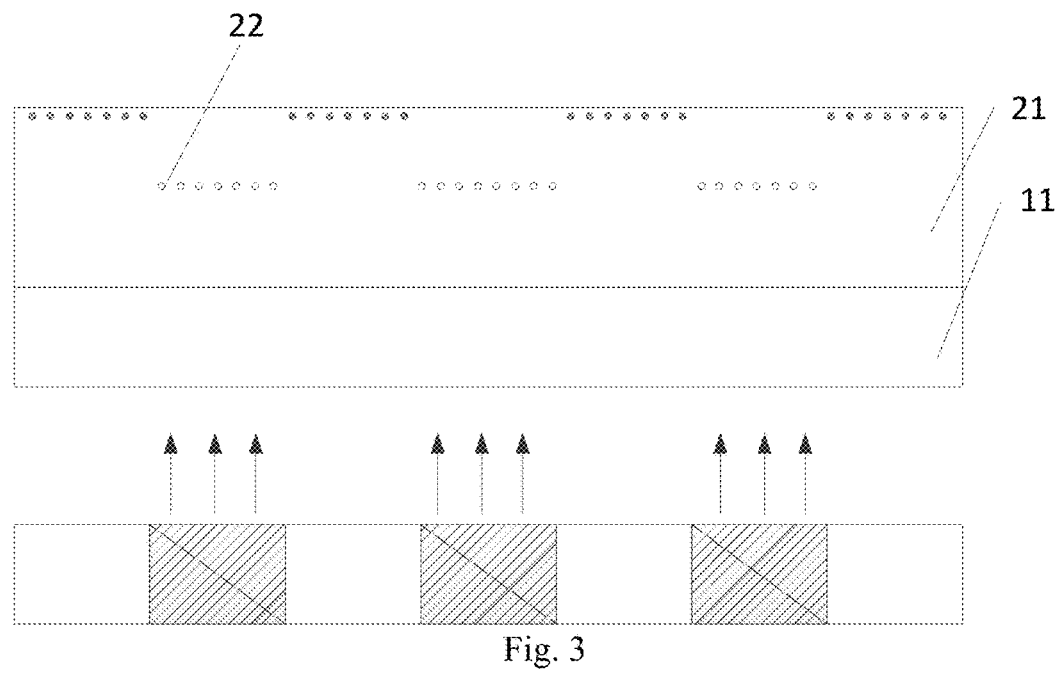
FIG. 3 is a schematic diagram of a process of manufacturing a pixel isolation bank according to an embodiment of the present disclosure.

Then, as shown in FIG. 3, the magnetic lyophobic material 22 in the photoresist is adjusted to a predetermined height of the photoresist layer 21 by a magnetic field. For example, the photoresist layer may be subjected to vacuum drying and pre-baking processes. The position of the magnetic lyophobic material 22 is adjusted during the pre-baking process.

Finally, as shown in FIG. 1, a portion of the adjusted photoresist layer is selectively removed to form a pixel isolation bank. For example, processes such as exposure and development can be performed on the adjusted photoresist layer 21 to remove the photoresist corresponding to the pixel recess 12.

An embodiment of the present disclosure provides a pixel isolation bank for improving the film quality of an organic functional layer surrounded by the pixel isolation bank. In the prior art, the sidewall of the pixel isolation bank is completely made of a lyophilic material. When an organic functional layer is formed by ink-jet printing, the organic functional layer may climb along the sidewall of the pixel isolation bank to a certain height, which may seriously affect the film quality. Compared with the prior art, the present disclosure provides a pixel isolation bank in a display panel, which may comprise: a lyophilic layer, a first lyophobic layer and an isolation layer. The lyophilic layer may be disposed on an electrode substrate, the first lyophobic layer may be disposed on one side of the lyophilic layer away from the electrode substrate. In some embodiments, the material of the first lyophobic layer may be a magnetic lyophobic material. The isolation layer may be disposed on one side of the lyophobic layer away from the lyophilic layer. When the ink in the pixel recess is dried, since the first lyophobic layer of the pixel isolation bank has a lyophobic property, the first lyophobic layer can suppress edge climbing phenomenon of the organic functional layer when the edge of the organic functional layer climbs to the position of the first lyophobic layer, thereby reducing the climbing height and improving the film quality of the organic functional layer.

Figure 6:
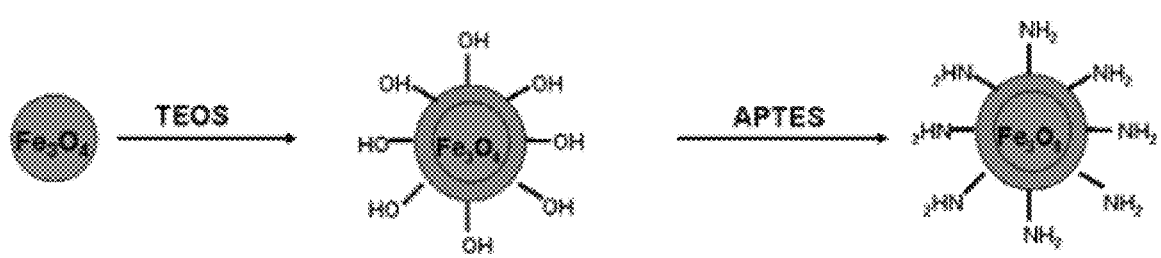
FIG. 6 is a schematic diagram of a reaction for forming triiron tetraoxide (Fe3O4) microspheres according to an embodiment of the present disclosure.
Figure 7:
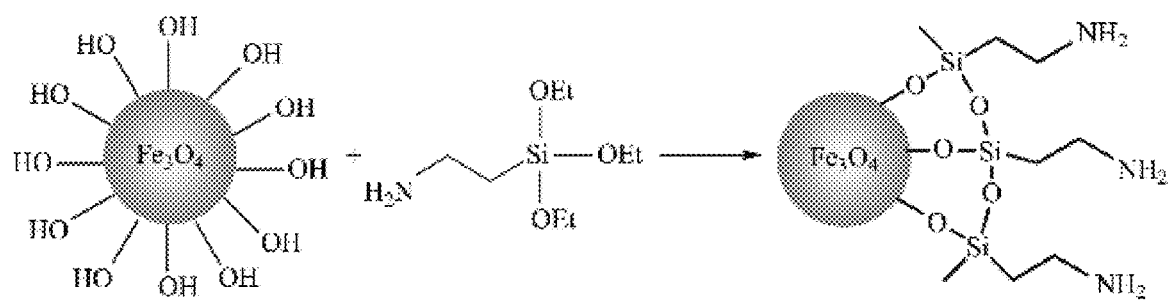
FIG. 7 is a schematic diagram of a reaction for forming Fe3O4 microspheres according to another embodiment of the present disclosure.

A variety of materials can be used for the lyophobic layer. Optionally, the material of the first lyophobic layer is a fluorine resin grafted with $Fe_3O_4$ microspheres. In some embodiments of the present disclosure, the fluorine resin grafted with $Fe_3O_4$ microspheres can have both magnetic and lyophobic properties. As shown in FIG. 6 and FIG. 7, the formation of functionalized $Fe_3O_4$ microspheres may comprise several steps. First, $Fe_3O_4$ is reacted with tetraethoxysilane (TEOS) to obtain hydroxylated $Fe_3O_4$ microspheres, which are then reacted with 3-aminopropyltriethoxysilane (APTES) to obtain aminated $Fe_3O_4$ microspheres. The aminated $Fe_3O_4$ microspheres are reacted with the functional groups on the backbone chain of the fluorine resin to be grafted to the backbone chain of the fluorine resin.

A variety of materials can be used for the isolation layer. Optionally, the material of the isolation layer is a lyophilic material. In some embodiments of the present disclosure, the material of the isolation layer may be the same as the material of the lyophilic layer, i.e., both of them may be made of a lyophilic material. A variety of lyophilic materials may be used. Optionally, the lyophilic material may be a second polymer grafted with a plurality of olefin units. The olefin unit may comprise mono-olefin. The general structure of mono-olefin can be: $CH_2$=CH—$(CH_2)_n$—H, wherein n=0-10. During the formation of the pixel isolation bank, the second polymer can be deposited at the bottom portion of the pixel isolation bank to form a lyophilic layer. When an organic functional layer surrounded by the pixel isolation bank is formed by ink-jet printing, since the lyophilic layer at the bottom portion of the pixel isolation bank has lyophilic property and has no repellent effect on the ink, the ink can form an organic functional layer with a flat surface in the pixel recesses, so as to improve the film quality.

Figure 4:
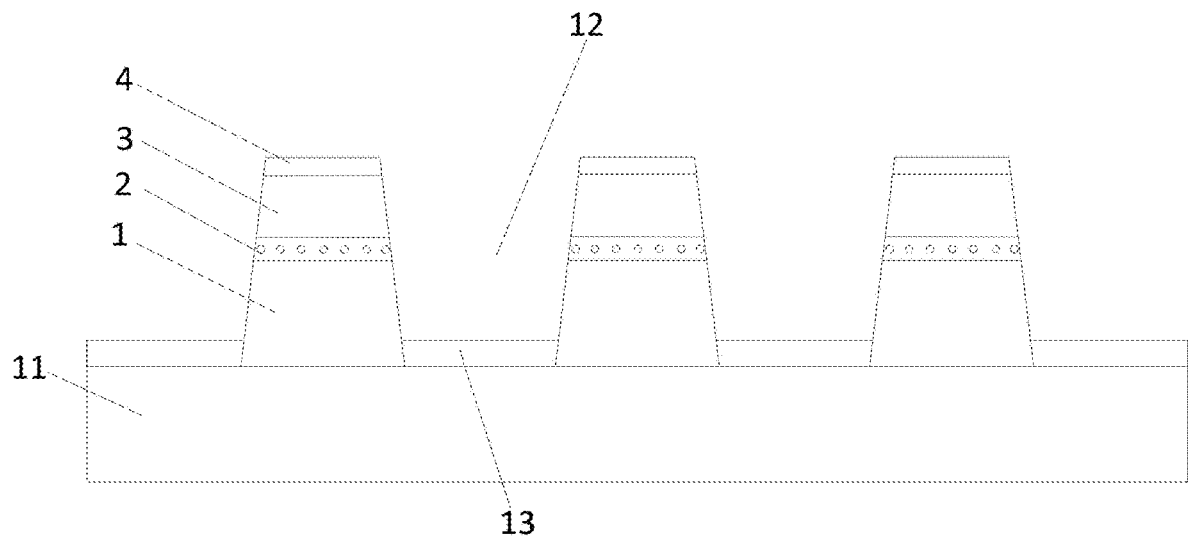
FIG. 4 is a schematic structural diagram of a pixel isolation bank according to another embodiment of the present disclosure.

FIG. 4 shows a structure of a display panel according to another embodiment of the present disclosure. As shown in FIG. 4, the pixel isolation bank further comprises: a second lyophobic layer 4 disposed on one side of the isolation layer 3 away from the first lyophobic layer 2, i.e., at the top portion of the pixel isolation bank. In some embodiments of the present disclosure, in the process of ink-jet printing, firstly, ink is dripped into the pixel recess 12 surrounded by the pixel isolation bank so that the pixel recess 12 is filled up with the ink. The second lyophobic layer 4 disposed at the top portion of the pixel isolation bank has lyophobic property, so that the ink in the pixel recess 12 can be suppressed from flowing out of the pixel recess 12 and the accuracy of ink dripping can be improved. In addition, the material of the second lyophobic layer 4 may be a lyophobic material which is different from the material of the first lyophobic layer 2. For example, the material of the second lyophobic layer 4 may not be magnetic. In one example, the material of the second lyophobic layer 4 may be a third polymer having a fluorine-containing unit grafted on its backbone chain.

Figure 5:
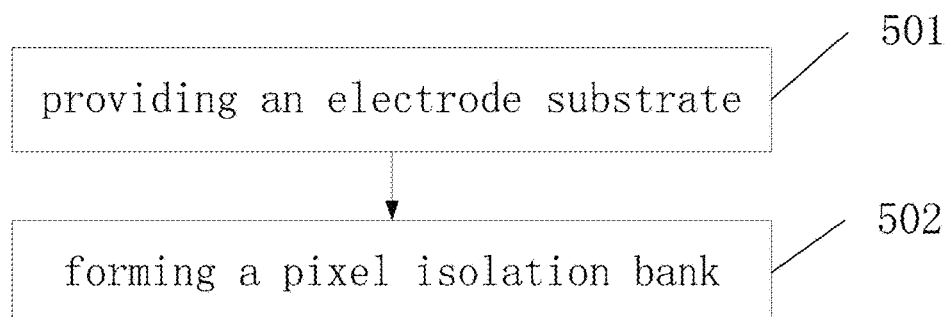
FIG. 5 shows a flowchart of a method for manufacturing a pixel isolation bank according to an embodiment of the present disclosure.

FIG. 5 shows a method for manufacturing a display panel according to an embodiment of the present disclosure, in which a photoresist containing a lyophilic material and a magnetic lyophobic material is used, the method comprising:

step 501: providing an electrode substrate; and
step 502: forming a pixel isolation bank.

The electrode substrate can be reasonably selected by those skilled in the art according to practical needs, which will not be described herein in detail.

Figure 9:
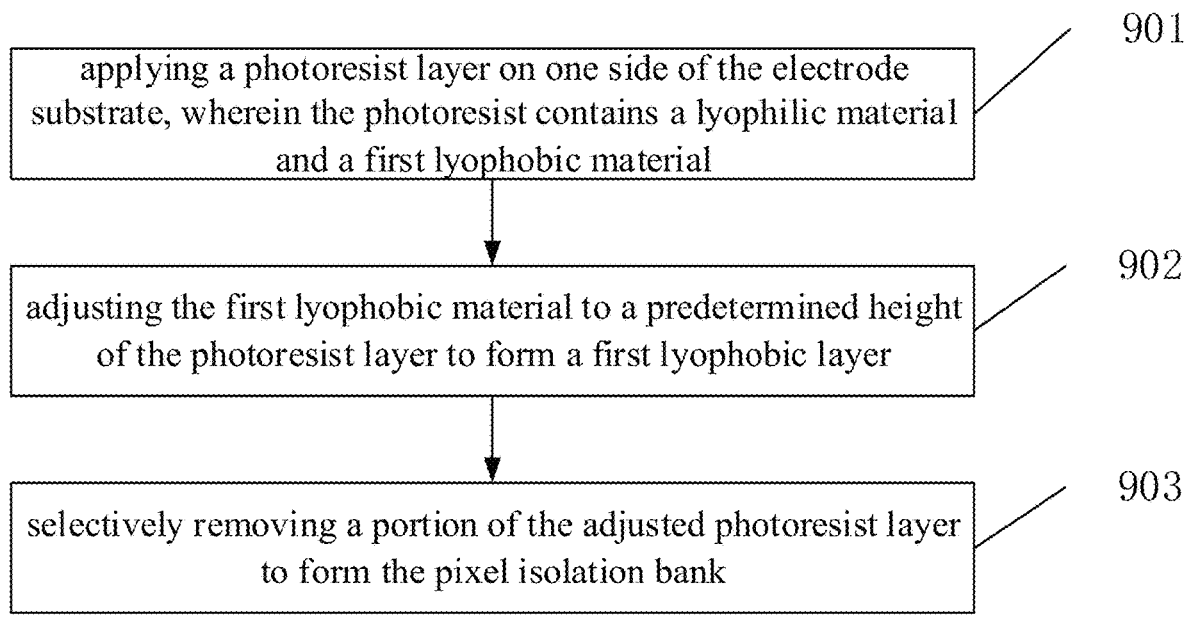
FIG. 9 shows a flowchart of a method for manufacturing a pixel isolation bank according to an embodiment of the present disclosure.

FIG. 9 shows a flowchart of a method for manufacturing a pixel isolation bank according to an embodiment of the present disclosure. As shown in FIG. 9, the pixel isolation bank may be formed by following steps.

Step 901, as shown in FIG. 2, forming a photoresist layer 21 on one side of the electrode substrate 11.

The photoresist may be formed on one side of the electrode substrate by a coating process. In this step, the photoresist layer is in a molten state. Since the surface energy of the first lyophobic material (such as magnetic lyophobic material) in the photoresist is small, the first lyophobic material is aggregated on the upper surface of the photoresist layer, while the lyophilic material is aggregated below the upper surface of the photoresist layer.

Step 902, adjusting the first lyophobic material 22 in the photoresist to a predetermined height of the photoresist layer 21.

In an exemplary embodiment, the first lyophobic material 22 may be a magnetic lyophobic material. As shown in FIG. 3, since the magnetic lyophobic material in the photoresist has the magnetic property, it can be driven to move in the photoresist layer by a magnetic field. In an actual application, the magnetic lyophobic material on the upper surface of the photoresist can be moved down to a predetermined height under the action of a magnetic field to form a first lyophobic layer. The position of the first lyophobic layer in the photoresist layer can be adjusted according to the magnitude of the magnetic field, so that the first lyophobic layer moves from the upper surface of the photoresist layer to a predetermined height in the photoresist layer. On both the upper and lower sides of the first lyophobic layer, a lyophilic material may be provided. In an example according to the present disclosure, the distance of the first lyophobic layer from the bottom of the photoresist layer may be greater than the thickness of the organic functional layer in the pixel recess, so that the first lyophobic layer does not affect the flatness of the organic functional layer, and can further suppress the edge climbing phenomenon of the organic functional layer and improve the film quality.

Step 903, selectively removing a portion of the adjusted photoresist layer to form the pixel isolation bank. For example, processes such as exposure and development can be performed on the adjusted photoresist layer 21 to remove a portion of the photoresist layer 21 corresponding to the pixel recess, so as to form the pixel isolation bank.

An embodiment of the present disclosure provides a method for manufacturing a display panel, for improving the film quality of an organic functional layer surrounded by a pixel isolation bank. In the prior art, the sidewall of the pixel isolation bank is completely made of a lyophilic material. Thus, when an organic functional layer is formed by ink-jet printing, the organic functional layer may climb along the sidewall of the pixel isolation bank to a certain height, which may seriously affect the film quality. In the solution of some embodiments of the present disclosure, ink-jet printing may be performed in the pixel recess formed by the above pixel isolation bank, during the drying of the ink in the pixel recess, the thickness of the organic functional layer formed by the ink may be smaller than the height of the lyophobic layer. Because the lyophobic layer is lyophobic, the edge climbing phenomenon of the organic functional layer can be suppressed, and the film quality can be improved.

According to one embodiment of the present disclosure, the magnetic lyophobic material in the photoresist may be adjusted to a predetermined height of the photoresist layer by a magnetic field during a process of pre-baking the photoresist layer. In an illustrative embodiment of the present disclosure, when the photoresist is coated to form a photoresist layer, since the photoresist is always in a dynamic state, a plurality of polymers in the photoresist are in a uniformly mixed state. When the pre-baking process is carried out after the coating of the photoresist, the photoresist is in a static state. Since the plurality of polymers in the photoresist have different surface energies, the plurality of polymers in a photoresist start to be layered. A fluorine-containing polymer will gradually move to the upper surface of the photoresist layer due to its smaller surface energy, while a polymer containing olefin units will move to a location below the upper surface of the photoresist layer. In some embodiments of the present disclosure, during the process of pre-baking the photoresist, the photoresist begins to solidify gradually, and the magnetic lyophobic material is driven by a magnetic field to move downward from the upper surface to a preset location. After the pre-baking process is completed, the magnetic lyophobic material can be fixed at the predetermined location (i.e., a predetermined height) in the photoresist layer. At that time, no movement of the magnetic lyophobic material occurs after the magnetic field is removed.

According to an embodiment of the present disclosure, a second lyophobic layer may also be formed at the top portion of the pixel isolation bank. The material of the second lyophobic layer (a second lyophobic material) may not be magnetic, for example, it may be a polymer having a fluorine-containing unit grafted on its backbone chain.

In an embodiment according to the present disclosure, in a photolithography process, except for a region having a preset pattern (i.e., a pattern of the pixel isolation bank), other region of the photoresist layer is removed after exposure and development processes. The photoresist layer in the preset pattern region forms a pixel isolation bank. Since the region other than the preset pattern region will be removed, only the location of the magnetic lyophobic material corresponding to the preset pattern region needs to be adjusted. That is, it is possible to adjust only the first lyophobic material at a position corresponding to the pattern of the pixel isolation bank to a predetermined height of the photoresist layer.

In some embodiments according to the present disclosure, the location of the magnetic lyophobic material may be adjusted by a magnetic field. The magnetic field can be formed in many ways. For example, the magnetic field may be formed by a permanent magnet. Optionally, the magnetic field may be formed by an electromagnetic plate. In some embodiments of the present disclosure, the shape of the electromagnetic plate may correspond to the pattern of the pixel isolation bank, so that the magnetic lyophobic material in the photoresist within a preset pattern region of the photoresist layer can be adjusted to a predetermined height of the photoresist layer by a magnetic field generated by the electromagnetic plate. In addition, a voltage on the electromagnetic plate can be adjusted to control the magnitude of the magnetic field, so as to conveniently control the location of the magnetic lyophobic material in the photoresist layer.

Optionally, the photoresist layer has a height of 1 μm-5 μm. The higher the height of the photoresist layer, the higher the height of the formed pixel isolation bank. When the organic functional layer is formed by ink-jet printing, more ink solution is stored in the pixel recess, thereby ensuring the thickness of the organic functional layer and improving the light-emitting effect of the organic functional layer.

An embodiment of the present disclosure provides a method for manufacturing a display panel, which can improve the film quality of an organic functional layer surrounded by a pixel isolation bank. In the prior art, the sidewall of the pixel isolation bank is completely made of a lyophilic material. Thus, when an organic functional layer is formed by ink-jet printing, the organic functional layer may climb along the sidewall of the pixel isolation bank to a certain height, which may seriously affect the film formation quality. In the solution of the present disclosure, ink-jet printing may be performed in a pixel recess formed by the above pixel isolation bank, during the drying of the ink in the pixel recess, the thickness of the organic functional layer formed by the ink may be smaller than the height of the lyophobic layer. Because the lyophobic layer has lyophobicity, the edge climbing phenomenon of the organic functional layer can be suppressed, and the film formation quality can be improved.

The disclosed above are only several specific embodiments of the present disclosure, however, the present disclosure is not limited to this. Any variation or replacement easily conceivable by those skilled in the art within the technical scope disclosed in the present disclosure shall fall within the protection scope of the present disclosure. Therefore, the protection scope of the present disclosure shall be determined by the terms of the claims.

The invention claimed is:

1. A pixel isolation bank, comprising:
a first lyophobic layer located at a predetermined height of the pixel isolation bank;
a lyophilic layer at a bottom of the pixel isolation bank, wherein the pixel isolation bank is an isolation structure,
the pixel isolation bank is formed by a mixture of different polymers having different properties comprising lyophilic, lyophobic and magnetic properties;
the polymers are configured to form different layers of the pixel isolation bank due to their different surface energy;
a second polymer of the polymers having the lyophilic property is configured to gather at the bottom of the pixel isolation bank to form the lyophilic layer, and
a first polymer of the polymers having the magnetic and lyophobic properties is configured to gather above the lyophilic layer under an action of a magnetic field to form the first lyophobic layer.

2. The pixel isolation bank according to claim 1, wherein the first polymer is a fluorine resin grafted with $Fe_3O_4$ microspheres.

3. The pixel isolation bank according to claim 1, further comprising
an isolation layer located on the first lyophobic layer.

4. The pixel isolation bank according to claim 1, further comprising a second lyophobic layer located at a top portion of the pixel isolation bank, wherein the second lyophobic layer is made of a polymer with a fluorine-containing unit grafted on its backbone chain.

5. A method for manufacturing a pixel isolation bank, comprising:
applying a photoresist layer on one side of an electrode substrate, wherein the photoresist layer comprises a lyophilic material and a first lyophobic material;

adjusting the first lyophobic material to a predetermined height of the photoresist layer to form a first lyophobic layer; and selectively removing a portion of the adjusted photoresist layer to form the pixel isolation bank, wherein the first lyophobic material is a magnetic lyophobic material, and the adjusting the first lyophobic material to a predetermined height of the photoresist layer comprises:

adjusting the first lyophobic material to the predetermined height of the photoresist layer by a magnetic field.

6. The method according to claim 5, wherein the adjusting the first lyophobic material to a predetermined height of the photoresist layer further comprises:

during a pre-baking process carried out on the photoresist layer, adjusting the magnetic lyophobic material to the predetermined height of the photoresist layer by a magnetic field.

7. The method according to claim 5, wherein the magnetic lyophobic material is a fluorine resin grafted with $Fe_3O_4$ microspheres.

8. The method according to claim 5, wherein the photoresist layer further contains a second lyophobic material that is nonmagnetic, the method further comprises forming a second lyophobic layer at a top portion of the pixel isolation bank with the second lyophobic material.

9. The method according to claim 7, wherein the second lyophobic layer is made of a polymer having a fluorine-containing unit grafted on its backbone chain.

10. The method according to claim 5, wherein the magnetic field is produced by an electromagnetic plate.

11. The method according to claim 10, wherein the electromagnetic plate has a shape corresponding to a pattern of the pixel isolation bank.

12. The method according to claim 5, wherein the adjusting the first lyophobic material to a predetermined height of the photoresist layer comprises:

adjusting only the first lyophobic material at a position corresponding to the pattern of the pixel isolation bank to the predetermined height of the photoresist layer.

13. A display panel, comprising the pixel isolation bank according to claim 1.

14. A display apparatus, comprising the display panel according to claim 13.

15. The pixel isolation bank according to claim 3, wherein the isolation layer comprises a lyophilic material.

16. The pixel isolation bank according to claim 15, wherein the isolation layer comprises the second polymer which is grafted with a plurality of olefin units.

17. The pixel isolation bank according to claim 1, wherein the pixel isolation bank is configured to isolate an organic functional layer for emitting light, a thickness of the organic functional layer is smaller than a thickness of the lyophilic layer, and the organic function layer is in contact with the lyophilic layer.

18. The pixel isolation bank according to claim 1, wherein the first polymer contains a magnetic unit, and a backbone chain of the first polymer is grafted with a plurality of functional units.

19. The pixel isolation bank according to claim 18, wherein the plurality of functional units include the magnetic unit and a fluorine-containing unit having a lyophobic property.

20. The pixel isolation bank according to claim 1, wherein the mixture of the polymers is a photoresist.

* * * * *